(12) United States Patent
Shin et al.

(10) Patent No.: US 11,908,807 B2
(45) Date of Patent: Feb. 20, 2024

(54) SEMICONDUCTOR DEVICE INCLUDING WELL REGION

(71) Applicant: SAMSUNG ELECTRONICS CO., LTD., Suwon-si (KR)

(72) Inventors: Huichul Shin, Uijeongbu-si (KR); Hyungjin Lee, Seoul (KR); Jinhong Park, Seoul (KR); Mingeun Song, Suwon-si (KR); Euiyoung Jeong, Suwon-si (KR); Hiroki Fujii, Seongnam-si (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 215 days.

(21) Appl. No.: 17/574,212

(22) Filed: Jan. 12, 2022

(65) Prior Publication Data
US 2022/0399284 A1 Dec. 15, 2022

(30) Foreign Application Priority Data
Jun. 14, 2021 (KR) .................. 10-2021-0076662

(51) Int. Cl.
*H01L 23/552* (2006.01)
*H01L 21/82* (2006.01)
*H01L 21/78* (2006.01)

(52) U.S. Cl.
CPC .................. *H01L 23/552* (2013.01)

(58) Field of Classification Search
CPC . H01L 23/552; H01L 23/585; H01L 21/7806; H01L 23/66; H01L 27/0248; H01L 21/823878; H01L 21/823892
(Continued)

(56) References Cited
U.S. PATENT DOCUMENTS
6,225,676 B1 5/2001 Hattori et al.
6,563,181 B1 5/2003 Du et al.
(Continued)

FOREIGN PATENT DOCUMENTS
JP 2002094033 A 3/2002
JP 2017117939 A 6/2017
(Continued)

OTHER PUBLICATIONS
US 7,339,243 B2, 03/2008, Lien et al. (withdrawn)

*Primary Examiner* — Didarul A Mazumder
(74) *Attorney, Agent, or Firm* — Sughrue Mion, PLLC

(57) ABSTRACT

A semiconductor device is provided. The semiconductor device includes: a substrate with first-conductivity-type impurities; first and second active regions provided on the substrate; a first deep element isolation layer surrounding the first active region; a second deep element isolation layer surrounding the second active region; a suction region surrounding the first and second deep element isolation layers, the suction region including the first-conductivity-type impurities; a well region provided in the substrate between the first and second active regions, the well region including second-conductivity-type impurities different from the first-conductivity-type impurities; a shallow element isolation layer provided between the suction region and the well region; and a guard structure connected to the suction region. The substrate includes a signal path portion that is provided between a top surface of the substrate and the well region, and surrounds an upper portion of the well region.

20 Claims, 11 Drawing Sheets

(58) Field of Classification Search
USPC .......................................................... 257/659
See application file for complete search history.

(56) References Cited

U.S. PATENT DOCUMENTS

| | | | |
|---|---|---|---|
| 7,982,282 B2 | 7/2011 | Zupac et al. | |
| 8,928,127 B2 | 1/2015 | Chen et al. | |
| 2006/0060934 A1* | 3/2006 | Lien | H01L 21/263 |
| | | | 257/499 |
| 2008/0061397 A1* | 3/2008 | Uchida | H01L 23/585 |
| | | | 257/508 |
| 2009/0267689 A1* | 10/2009 | Zupac | H03F 1/083 |
| | | | 330/250 |
| 2010/0102414 A1 | 4/2010 | Yamanaka et al. | |
| 2012/0074515 A1* | 3/2012 | Chen | H01L 21/76224 |
| | | | 257/491 |
| 2012/0299114 A1* | 11/2012 | Otake | H01L 29/1004 |
| | | | 257/370 |
| 2013/0328123 A1* | 12/2013 | Chen | H01L 29/7809 |
| | | | 257/E21.409 |
| 2020/0091341 A1* | 3/2020 | Iwatsu | H01L 29/66659 |

FOREIGN PATENT DOCUMENTS

| | | |
|---|---|---|
| KR | 20000011173 A | 2/2000 |
| KR | 1020040053273 A | 6/2004 |

\* cited by examiner

SEMICONDUCTOR DEVICE INCLUDING WELL REGION

CROSS-REFERENCE TO RELATED APPLICATION

This application claims priority from Korean Patent Application No. 10-2021-0076662, filed on Jun. 14, 2021, in the Korean Intellectual Property Office, the disclosure of which is incorporated by reference herein in its entirety.

BACKGROUND

1. Field

Methods, apparatuses and systems consistent with example embodiments relate to a semiconductor device, and particularly to a semiconductor device including a well region.

2. Description of Related Art

Semiconductor devices are an important element in electronics industries, allowing for miniaturization, multifunctionalization, low manufacturing costs, etc. Semiconductor devices include a semiconductor memory device to store logic data, a semiconductor logic device to arithmetically process logic data, a hybrid semiconductor device including a memory element and a logic element, etc. In accordance with advances in electronics industries, demand for characteristics of semiconductor devices is gradually increasing. For example, demand for high reliability, high speed, multifunctionalization, etc. of semiconductor devices is gradually increasing. In order to satisfy such demanded characteristics, structures in semiconductor devices become more and more complicated. In addition, semiconductor devices become more and more highly integrated.

SUMMARY

One or more example embodiments provide a semiconductor device having enhanced electrical characteristics.

According to an example embodiment, a semiconductor device includes: a substrate comprising first-conductivity-type impurities; a first active region and a second active region provided on the substrate; a first deep element isolation layer surrounding the first active region; a second deep element isolation layer surrounding the second active region; a suction region surrounding the first deep element isolation layer and the second deep element isolation layer, the suction region comprising the first-conductivity-type impurities; a well region provided in the substrate between the first active region and the second active region, the well region comprising second-conductivity-type impurities different from the first-conductivity-type impurities; a shallow element isolation layer provided between the suction region and the well region; and a guard structure connected to the suction region. The substrate includes a signal path portion that is provided between a top surface of the substrate and the well region, and surrounds an upper portion of the well region.

According to an example embodiment, a semiconductor device includes: a substrate comprising first-conductivity-type impurities; a first active region and a second active region provided on the substrate; a suction region surrounding the first active region and the second active region, the suction region comprising the first-conductivity-type impurities; and a well region provided in the substrate between the first active region and the second active region, the well region comprising second-conductivity-type impurities different from the first-conductivity-type impurities. The well region is spaced apart from a top surface of the substrate and the suction region, and a minimum distance between the well region and the top surface of the substrate is smaller than a width of the suction region along a first direction parallel to the top surface of the substrate.

According to an example embodiment, a semiconductor device includes: a substrate comprising first-conductivity-type impurities; an active region provided on the substrate; a suction region surrounding the active region and comprising the first-conductivity-type impurities; and a guard structure connected to the suction region. The guard structure includes first guard vias and second guard vias provided on the suction region, and a first guard line provided on the first guard vias and the second guard vias, and an outer longer side wall of one of the first guard vias faces inner longer side walls of two of the second guard vias.

BRIEF DESCRIPTION OF THE DRAWINGS

The above and other aspects, features, and advantages will be more clearly understood from the following detailed description, taken in conjunction with the accompanying drawings.

DETAILED DESCRIPTION

Hereinafter, example embodiments will be described with reference to the accompanying drawings.

Figure 1A:
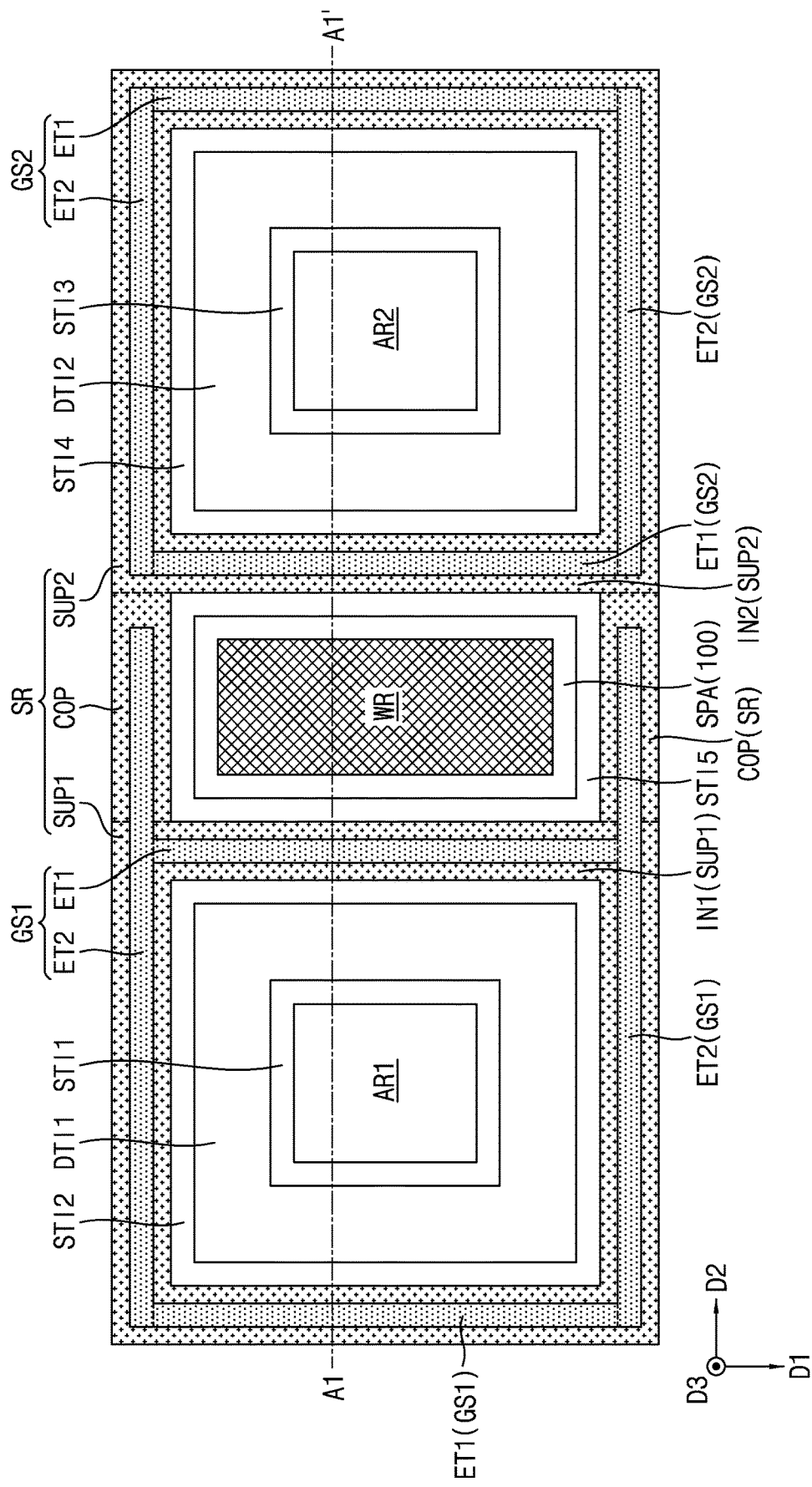
FIG. 1A is a plan view of a semiconductor device according to example embodiments.
Figure 1B:
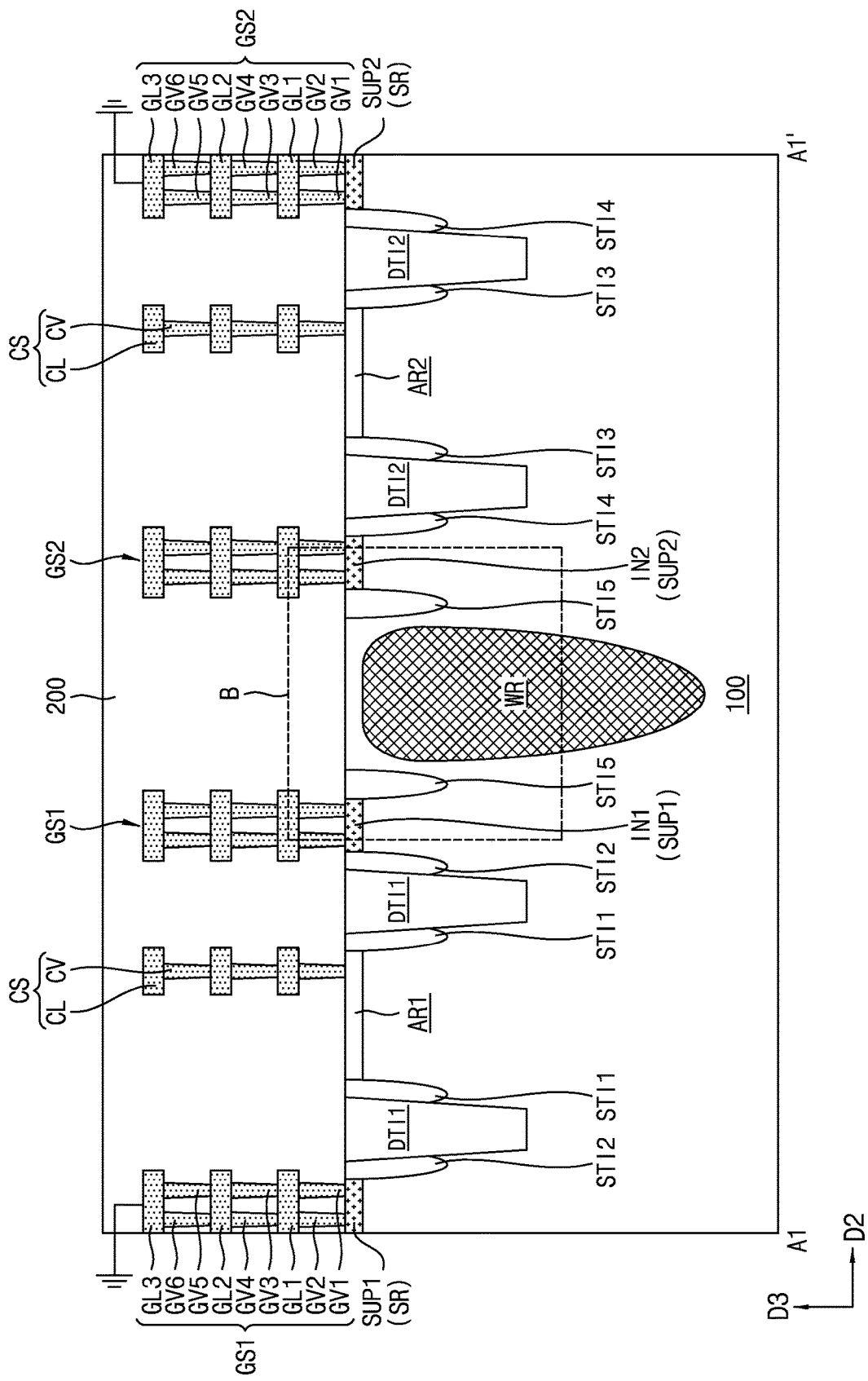
FIG. 1B is a cross-sectional view taken along line A1-A1' in FIG. 1A.
Figure 1C:
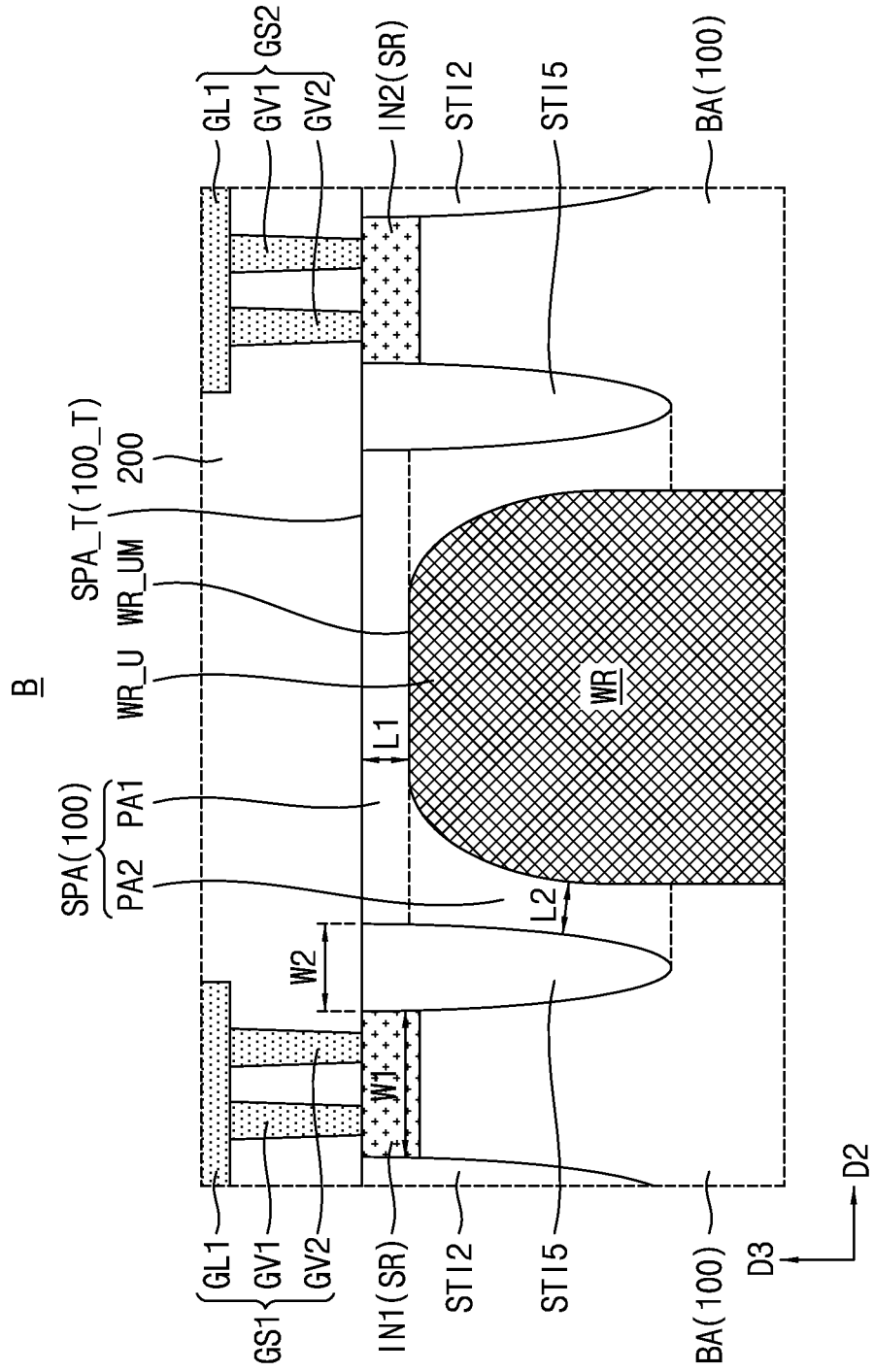
FIG. 1C is an enlarged view of a portion B of FIG. 1B.
Figure 1D:
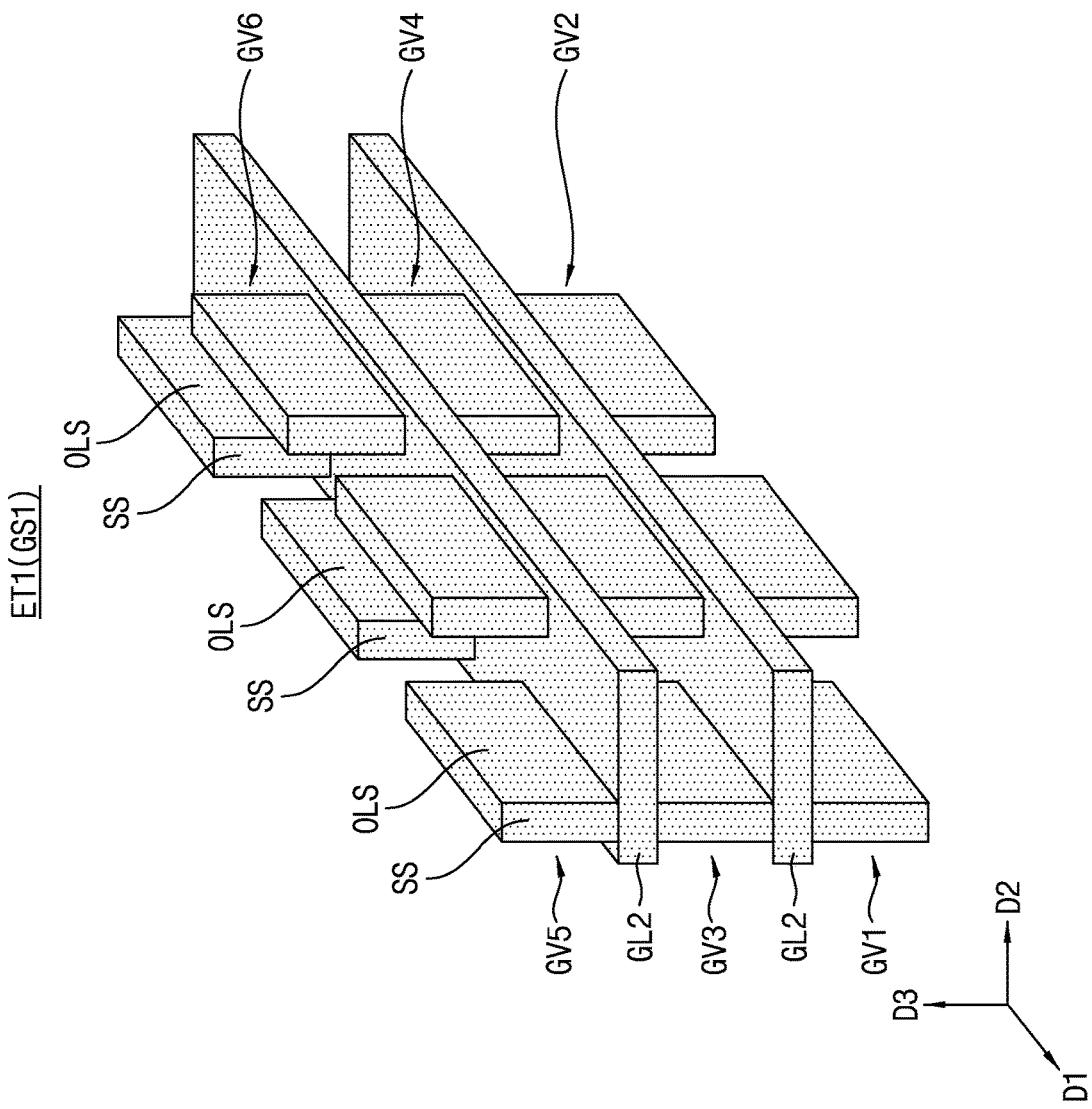
FIGS. 1D and 1E are views explaining an arrangement structure of guard vias.
Figure 1E:
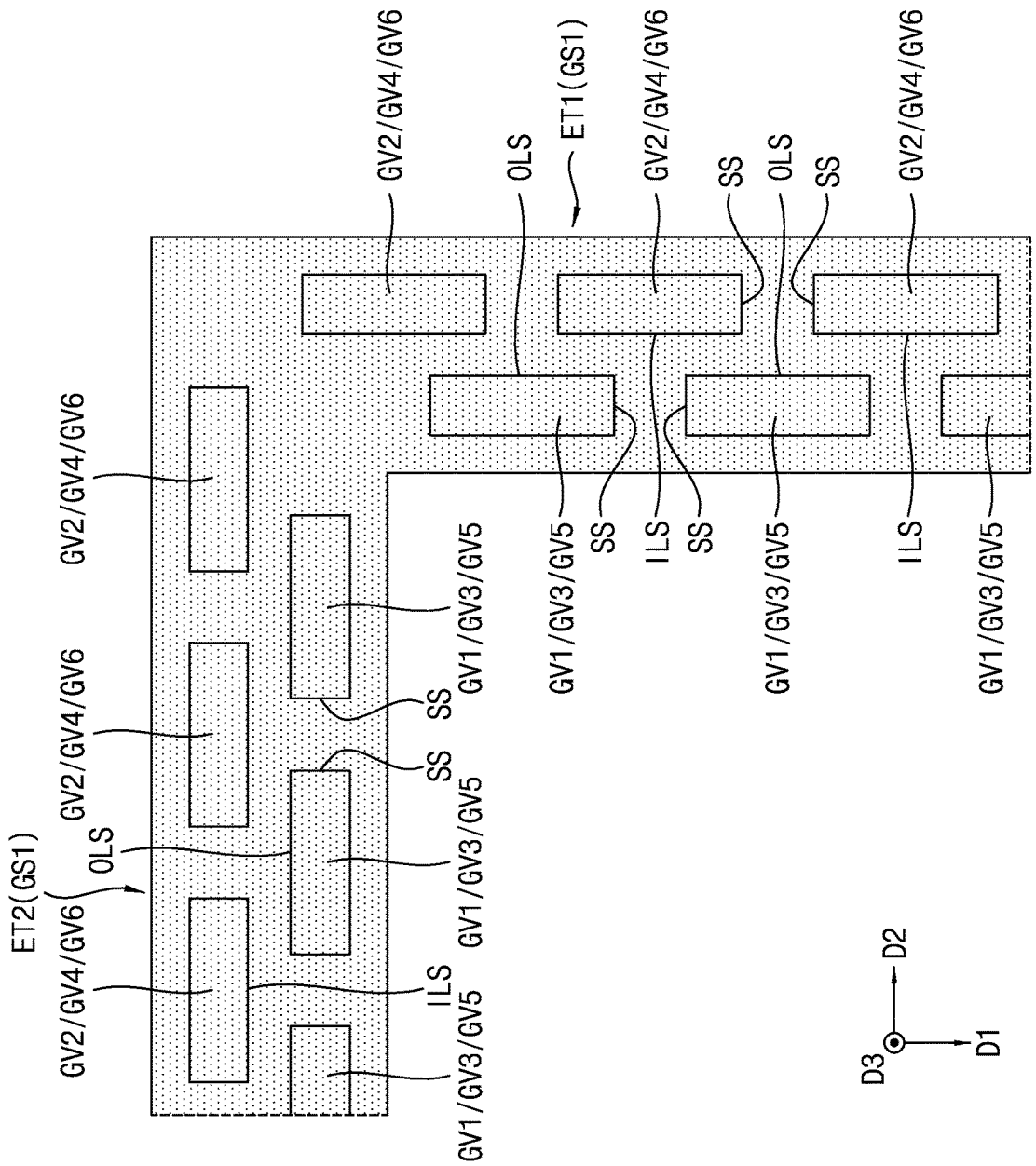

FIG. 1A is a plan view of a semiconductor device according to example embodiments. FIG. 1B is a cross-sectional view taken along line A1-A1' in FIG. 1A. FIG. 1C is an enlarged view of a portion B of FIG. 1B. FIGS. 1D and 1E are views explaining an arrangement structure of guard vias.

Referring to FIGS. 1A and 1B, the semiconductor device may include a substrate 100. The substrate 100 may have the form of a plate extending along a plane that extends in a first direction D1 and a second direction D2. In example embodiments, the substrate 100 may be a semiconductor substrate. For example, the substrate 100 may be a silicon substrate. In example embodiments, the substrate 100 may be a silicon-on-insulator (SOI) substrate.

The substrate 100 may include first-conductivity-type impurities. In example embodiments, the first-conductivity-type impurities may be P-type impurities. In this case, the first-conductivity-type impurities may be, for example, B or $BF_2$. In example embodiments, the first-conductivity-type impurities may be N-type impurities. In this case, the first-conductivity-type impurities may be, for example, P or As.

A first active region AR1 and a second active region AR2 may be provided on the substrate 100. The first active region AR1 and the second active region AR2 may be spaced apart from each other. For example, the first active region AR1 and the second active region AR2 may be spaced apart from each other in the second direction D2. Each of the first active region AR1 and the second active region AR2 may include a circuit. The circuits of the first and second active regions AR1 and AR2 may include, for example, a memory device or a logic device.

First and second deep element isolation layers DTI1 and DTI2 may be provided on the substrate 100. The first deep element isolation layer DTI1 may surround at least a portion of the first active region AR1, and the second deep element isolation layer DTI2 may surround at least a portion of the second active region AR2. Each of the first and second deep element isolation layers DTI1 and DTI2 may include portions extending in the first direction D1, and portions extending in the second direction D2. The first and second deep element isolation layers DTI1 and DTI2 may include an insulating material. For example, the first and second deep element isolation layers DTI1 and DTI2 may include oxide.

First to fifth shallow element isolation layers STI1, STI2, STI3, STI4 and STI5 may be provided on the substrate. The first to fifth shallow element isolation layers STI1, STI2, STI3, STI4 and STI5 may have a smaller depth than the first and second deep element isolation layers DTI1 and DTI2. The level of lowermost portions of the first to fifth shallow element isolation layers STI1, STI2, STI3, STI4 and STI5 may be higher than the level of lowermost portions of the first and second deep element isolation layers DTI1 and DTI2.

The first shallow element isolation layer STI1 may be disposed between the first deep element isolation layer DTI1 and the first active region AR1. The first shallow element isolation layer STI1 may surround at least a portion of the first active region AR1. The second shallow element isolation layer STI2 may be disposed between a suction region SR, which will be described later, and the first deep element isolation layer DTI1. The second shallow element isolation layer STI2 may surround at least a portion of each of the first active region AR1, the first shallow element isolation layer STI1 and the first deep element isolation layer DTI1. The third shallow element isolation layer STI3 may be disposed between the second deep element isolation layer DTI2 and the second active region AR2. The third shallow element isolation layer STI3 may surround at least a portion of the second active region AR2. The fourth shallow element isolation layer STI4 may be disposed between the suction region SR and the second deep element isolation layer DTI2. The fourth shallow element isolation layer STI4 may surround at least a portion of each of the second active region AR2, the third shallow element isolation layer STI3 and the second deep element isolation layer DTI2. The fifth shallow element isolation layer STI5 may be disposed between the first and second active regions AR1 and AR2. The fifth shallow element isolation layer STI5 may surround an upper portion of a well region WR, which will be described later. The fifth shallow element isolation layer STI5 may be disposed between the well region WR and the suction region SR. The fifth shallow element isolation layer STI5 may be a shallow element isolation layer adjacent to the well region WR. Each of the first to fifth shallow element isolation layers STI1, STI2, STI3, STI4 and STI5 may include portions extending in the first direction D1, and portions extending in the second direction D2. The first to fifth shallow element isolation layers STI1, STI2, STI3, STI4 and STI5 may include an insulating material. For example, the first to fifth shallow element isolation layers STI1, STI2, STI3, STI4 and STI5 may include oxide.

The suction region SR may be provided on the substrate 100. The suction region SR may include the same semiconductor material as the substrate 100. The suction region SR may include the same first-conductivity-type impurities as the substrate 100. In example embodiments, the concentration of the first-conductivity-type impurities in the suction region SR may be different from the concentration of the first-conductivity-type impurities in the substrate 100. For example, the concentration of the first-conductivity-type impurities in the suction region SR may be higher than the concentration of the first-conductivity-type impurities in the substrate 100.

The suction region SR may surround at least a portion of each of the first and second active regions AR1 and AR2. The suction region SR may surround an upper portion of each of the first to fifth shallow element isolation layers STI1, STI2, STI3, STI4 and STI5 and the first and second deep element isolation layers DTI1 and DTI2. The suction region SR may surround the well region WR when viewed from a planar view point according to FIG. 1A.

The suction region SR may include a first surround section SUP1 surrounding at least a portion of each of the first active region AR1, the first and second shallow element isolation layers STI1 and STI2, and the first deep element isolation layer DTI1, a second surround section SUP2 surrounding at least a portion of each of the second active region AR2, the third and fourth shallow element isolation layers STI3 and STI4, and the second deep element isolation layer DTI2, and connecting sections COP connecting the first and second surround sections SUP1 and SUP2. The connecting sections COP may be disposed between the first and second surround sections SUP1 and SUP2. The well region WR and the fifth shallow element isolation layer STI5 may be disposed between the first and second surround sections SUP1 and SUP2. The well region WR and the fifth shallow element isolation layer STI5 may be disposed between the connecting sections COP. The connecting sections COP may extend in the second direction D2. Each of the first and second surround sections SUP1 and SUP2 may include portions extending in the first direction D1, and portions extending in the second direction D2. The suction region SR has been described as being divided into the first and second surround sections SUP1 and SUP2 and the connecting sections COP for convenience of description, however example embodiments are not limited thereto, and the first and second surround sections SUP1 and SUP2 and the connecting sections COP may be interconnected without boundaries between the sections.

The first surround section SUP1 of the suction region SR may include a first intermediate portion IN1 interposed between the second and fifth shallow element isolation layers STI2 and STI5. The second surround section SUP2 of the suction region SR may include a second intermediate portion IN2 interposed between the fourth and fifth shallow element isolation layers STI4 and STI5. The first and second intermediate portions IN1 and IN2 may extend in the first direction D1. The first intermediate portion IN1 may be disposed between the first active region AR1 and the well region WR. The second intermediate portion IN2 may be disposed between the second active region AR2 and the well region WR.

The well region WR may be provided in the substrate 100. The well region WR may include second-conductivity-type impurities different from those of the substrate 100 and the suction region SR. In example embodiments, when the substrate 100 and the suction region SR include P-type impurities, the well region WR may include N-type impurities. In example embodiments, when the substrate 100 and the suction region SR include N-type impurities, the well region WR may include P-type impurities.

A preliminary substrate may be defined before formation of the suction region SR and the well region WR, and the suction region SR and the well region WR may be formed in accordance with doping of impurities in portions of the preliminary substrate. Portions of the preliminary substrate, except for portions of the preliminary substrate where the suction region SR and the well region WR are formed, may be referred to as the substrate 100.

The well region WR may be disposed between the first and second active regions AR1 and AR2. The well region WR may be disposed between the first and second deep element isolation layers DTI1 and DTI2. The level of a lowermost portion of the well region WR may be lower than the levels of lowermost portions of the first and second deep element isolation layers DTI1 and DTI2, the first to fifth shallow element isolation layers STI1, STI2, STI3, STI4 and STI5 and the suction region TSR.

Conductive structures CS may be provided. The conductive structures CS may be connected to the first and second active regions AR1 and AR2, respectively. The conductive structures CS may be electrically connected to circuits of the first and second active regions AR1 and AR2, respectively.

The conductive structure CS may include conductive vias CV and conductive lines CL. The conductive vias CV and the conductive lines CL may be alternately provided along a third direction D3. The third direction D3 may intersect the first direction D1 and the second direction D2. For example, the third direction D3 may perpendicularly intersect the first direction D1 and the second direction D2. Although the conductive structure CS is shown as including three conductive lines CL, the number of conductive lines CL of the conductive structure CS is not limited thereto. The conductive vias CV and the conductive lines CL of the conductive structure CS may include a conductive material. For example, the conductive vias CV and the conductive lines CL of the conductive structure CS may include metal.

First and second guard structures GS1 and GS2 may be provided. The first and second guard structures GS1 and GS2 may be connected to the suction region SR. The first and second guard structures GS1 and GS2 may be provided on the suction region SR. When viewed from a planar viewpoint according to FIG. 1A, the first guard structure GS1 may surround the first active region AR1, the first and second shallow element isolation layers STI1 and STI2, and the first deep element isolation layer DTI1. When viewed from a planar viewpoint according to FIG. 1A, the second guard structure GS2 may surround the second active region AR2, the third and fourth shallow element isolation layers STI3 and STI4, and the second deep element isolation layer DTI2.

Each of the first and second guard structures GS1 and GS2 may include first extensions ET1 extending in the first direction D1, and second extensions ET2 extending in the second direction D2. The first guard structure GS1 may include two first extensions ET1 and two second extensions ET2. The first active region AR1, the first and second shallow element isolation layers STI1 and STI2, and the first deep element isolation layer DTI1 may be provided between the first extensions ET1 of the first guard structure GS1 and between the second extensions ET2 of the first guard structure GS1. The well region WR and the fifth shallow element isolation layer STI5 may be provided between the second extensions ET2 of the first guard structure GS1. The second extension ET2 of the first guard structure GS1 may extend from the first surround section SUP1 of the suction region SR to the connecting section COP of the suction region SR. A portion of the second extension ET2 of the first guard structure GS1 may be disposed on the connecting section COP of the suction region SR.

The second guard structure GS2 may include two first extensions ET1 and two second extensions ET2. The second active region AR2, the third and fourth shallow element isolation layers STI3 and STI4, and the second deep element isolation layer DTI2 may be provided between the first extensions ET1 of the second guard structure GS2 and between the second extensions ET2 of the second guard structure GS2. The numbers of the first and second extensions ET1 and ET2 of the first and second guide structures GS1 and GS2 are not limited to the above-described numbers, and may vary according to example embodiments.

The widths of the first and second guard structures GS1 and GS2 are shown in FIG. 1A as being smaller than the width of the suction region SR for convenience of description, however example embodiments are not limited thereto. In example embodiments, the widths of the first and second guard structures GS1 and GS2 may be greater than the width of the suction region SR.

Each of the first and second guard structures GS1 and GS2 may include first and second guard vias GV1 and GV2 on the suction region SR, a first guard line GL1 on the first and second guard vias GV1 and GV2, third and fourth guard vias GV3 and GV4 on the first guide line GL1, a second guard line GL2 on the third and fourth guard vias GV3 and GV4, fifth and sixth guard vias GV5 and GV6 on the second guard line GL2, and a third guard line GL3 on the fifth and sixth guard vias GV5 and GV6.

Each of the first to third guard lines GL1, GL2 and GL3 of the first guard structure GS1 may surround the first active region AR1, the first and second shallow element isolation layers STI1 and STI2, and the first deep element isolation layer DTI1 when viewed from a planar viewpoint according to FIG. 1A. Each of the first to third guard lines GL1, GL2 and GL3 of the second guard structure GS2 may surround the second active region AR2, the third and fourth shallow element isolation layers STI3 and STI4, and the second deep element isolation layer DTI2 when viewed from a planar viewpoint according to FIG. 1A. Each of the first to third guard lines GL1, GL2 and GL3 of the first and second guard structures GS1 and GS2 may include portions extending in the first direction D1, and portions extending in the second direction D2.

The first and second guard structures GS1 and GS2 may be spaced apart from each other in the second direction D2. The first and second guard structures GS1 and GS2 may be spaced apart from each other at a portion of the suction region SR at which the second surround section SUP2 and the connecting section COP are interconnected.

The first to sixth guide vias GV1, GV2, GV3, GV4, GV5 and GV6 and the first to third guard lines GL1, GL2 and GL3 of the first and second guard structures GS1 and GS2 may include a conductive material. For example, the first to sixth guide vias GV1, GV2, GV3, GV4, GV5 and GV6 and the first to third guard lines GL1, GL2 and GL3 of the first and second guard structures GS1 and GS2 may include metal.

The first and second guard structures GS1 and GS2 may be connected to a ground node. Accordingly, the first and second guard structures GS1 and GS2 and the suction region SR may be electrically grounded.

An insulating layer 200 may be provided on the substrate 100. The insulating layer 200 may cover the substrate 100, the first and second active regions AR1 and AR2, the first and second deep element isolation layers DTI1 and DTI2, the first to fifth shallow element isolation layers STI1, STI2, STI3, STI4 and STI5, the suction region SR, the conductive structures CS, and the first and second guard structures GS1 and GS2. The insulating layer 200 may include an insulating material. For example, the insulating layer 200 may include oxide.

Referring to FIG. 1C, the well region WR may be spaced apart from a top surface 100_T of the substrate 100. An uppermost portion WR_UM of the well region WR may be spaced apart from the top surface 100_T of the substrate 100. The minimum distance between the top surface 100_T of the substrate 100 and the well region WR may be referred to as a first distance L1. For example, the first distance L1 may be a distance in the third direction D3 between the top surface 100_T of the substrate 100 and the well region WR.

The first distance L1 may be smaller than the width of the suction region SR. For example, the width in the second direction D1 of the intermediate portion IN1 of the suction region SR may be referred to as a first width W1, and the first distance L1 may be smaller than the first width W1. The first distance L1 may be smaller than the maximum width of the first to fifth shallow element isolation layers STI1, STI2, STI3, STI4 and STI5. For example, the maximum width in the second direction D2 of the fifth shallow element isolation layer STI5 may be referred to as a second width W2, and the first distance L1 may be smaller than the second width W2. The first distance L1 may be smaller than the maximum width of the first and second deep element isolation layers DTI1 and DTI2.

The well region WR may be spaced apart from the suction region SR. The well region WR may be spaced apart from the fifth shallow element isolation layer STI5 surrounding an upper portion thereof. The minimum distance between the well region WR and the fifth shallow element isolation layer STI5 may be referred to as a second distance L2.

The second distance L2 may be smaller than the width of the suction region SR. For example, the second distance L2 may be smaller than the first width W1. The second distance L2 may be smaller than the maximum width of the first to fifth shallow element isolation layers STI1, STI2, STI3, STI4 and STI5. For example, the second distance L2 may be smaller than the second width W2. The second distance L2 may be smaller than the maximum width of the first and second deep element isolation layers DTI1 and DIT2.

The substrate 100 may include a base portion BA and a signal path portion SPA. The base portion BA may be a portion contacting a lower portion of the well region WR. The signal path portion SPA may be a portion contacting an upper portion WR_U of the well region WR. The signal path portion SPA may cover the uppermost portion WR_UM of the well region WR. The signal path portion SPA may surround the upper portion WR_U of the well region WR. The top surface 100_T of the substrate 100 may be a top surface SPA_T of the signal path portion SPA.

The signal path portion SPA of the substrate 100 may include a first path portion PA1 and a second path portion PA2. The first path portion PA1 may be a portion disposed at a higher level than the uppermost portion WR_UM of the well region WR, and the second path portion PA2 may be a portion disposed at a lower level than the uppermost portion WR_UM of the well region WR.

The first path portion PA1 may be provided between uppermost portion WR_UM of the well region WR and the top surface SPA_T of the signal path portion SPA. The first path portion PA1 may cover the uppermost portion WR_UM of the well region WR. The first path portion PA1 may contact the uppermost portion WR_UM of the well region WR. The first path portion PA1 may be interposed between the insulating layer 200 and the well region WR. The minimum width of the first path portion PA1 may be equal to the first distance L1. The first path portion PA1 may overlap with the well region WR in the third direction D3. For example, the first path portion PA1 may vertically overlap with the well region WR. The first path portion PA1 may include first-conductivity-type impurities different from those of the well region WR.

The second path portion PA2 may be provided between the well region WR and the fifth shallow element isolation layer STI5. The second path portion PA2 may contact a side wall of the well region WR. The second path portion PA2 may contact the fifth shallow element isolation layer STI5. The minimum width of the second path portion PA2 may be equal to the second distance L2. The second path portion PA2 may surround the upper portion WR_U of the well region WR. The second path portion PA2 may include first-conductivity-type impurities different from those of the well region WR.

The substrate 100 has been described as being divided into the base portion BA, the first path portion PA1 and the second path portion PA2 for convenience of description, however example embodiments are not limited thereto and the base portion BA, the first path portion PA1 and the second path portion PA2 of the substrate 100 may be interconnected without boundaries therebetween. The second path portion PA2 may be connected to the base portion BA, and the first path portion PA1 may be connected to the second path portion PA2.

Referring to FIGS. 1D and 1E, the guard vias included in the first guard structure GS1 may be illustrated. The guard vias included in the second guard structure GS2 may be similar to the guard vias included in the first guard structure GS1, which will be described below.

The first to sixth guard vias GV1, GV2, GV3, GV4, GV5 and GV6 of the first extension ET1 of the first guard structure GS1 may be arranged in an extension direction of the first extension ET1, that is, the first direction D1, and the first to sixth guard vias GV1, GV2, GV3, GV4, GV5 and GV6 of the second extension ET2 of the first guard structure GS1 may be arranged in an extension direction of the second extension ET2, that is, the second direction D2.

The first guard vias GV1 of the first guard structure GS1 may be disposed nearer to the first active region AR1 than the second guard vias GV2 of the first guard structure GS1, the third guard vias GV3 of the first guard structure GS1 may be disposed nearer to the first active region AR1 than the fourth guard vias GV4 of the first guard structure GS1, and the fifth guard vias GV5 of the first guard structure GS1 may be disposed nearer to the first active region AR1 than the sixth guard vias GV6 of the first guard structure GS1.

Each of the first to sixth guard vias GV1, GV2, GV3, GV4, GV5 and GV6 may include shorter side walls SS. The shorter side walls SS of the first to sixth guard vias GV1, GV2, GV3, GV4, GV5 and GV6 may be shorter ones of side walls of the first to sixth guard vias GV1, GV2, GV3, GV4, GV5 and GV6. The shorter side walls SS of the first guard vias GV1 adjacent to each other may face each other while being spaced apart from each other. The shorter side walls SS of the second guard vias GV2 adjacent to each other may face each other while being spaced apart from each other. The shorter side walls SS of the third guard vias GV3 adjacent to each other may face each other while being spaced apart from each other. The shorter side walls SS of the fourth guard vias GV4 adjacent to each other may face each other while being spaced apart from each other. The shorter side walls SS of the fifth guard vias GV5 adjacent to each other may face each other while being spaced apart from each other. The shorter side walls SS of the sixth guard vias GV6 adjacent to each other may face each other while being spaced apart from each other.

The first, third and fifth guard vias GV1, GV3 and GV5 may include outer longer side walls OLS facing the second, fourth and sixth guard vias GV2, GV4 and GV6, respectively. The second, fourth and sixth guard vias GV2, GV4 and GV6 may include inner longer side walls ILS facing the first, third and fifth guard vias GV1, GV3 and GV5, respectively.

The outer longer side wall OLS of one first guard via GV1 may face the inner longer side walls ILS of two second guard vias GV2. The outer longer side wall OLS of one first guard via GV1 may overlap with the inner longer side walls ILS of two second guard vias GV2. For example, the outer longer side wall OLS of one first guard via GV1 included in the first extension ET1 may overlap with the inner longer side walls ILS of two second guard vias GV2 included in the first extension ET1 in the second direction D2. The inner longer side wall ILS of one second guard via GV2 may face the outer longer side walls OLS of two first guard vias GV1. The inner longer side wall ILS of one second guard via GV2 may overlap with the outer longer side walls OLS of two first guard vias GV1. The outer longer side wall OLS of one third guard via GV3 may face the inner longer side walls ILS of two fourth guard vias GV4. The outer longer side wall OLS of one third guard via GV3 may overlap with the inner longer side walls ILS of two fourth guard vias GV4. The inner longer side wall ILS of one fourth guard via GV4 may face the outer longer side walls OLS of two third guard vias GV3. The inner longer side wall ILS of one fourth guard via GV4 may overlap with the outer longer side walls OLS of two third guard vias GV3. The outer longer side wall OLS of one fifth guard via GV5 may face the inner longer side walls ILS of two sixth guard vias GV6. The outer longer side wall OLS of one fifth guard via GV5 may overlap with the inner longer side walls ILS of two sixth guard vias GV6. The inner longer side wall ILS of one sixth guard via GV6 may face the outer longer side walls OLS of two fifth guard vias GV5. The inner longer side wall ILS of one sixth guard via GV6 may overlap with the outer longer side walls OLS of two fifth guard vias GV5.

Opposite ends of one first guard via GV1 may overlap with ends of two second guard vias GV2. For example, opposite ends of one first guard via GV1 included in the first extension ET1 may overlap with ends of two second guard vias GV2 included in the first extension ET1 in the second direction D2. Opposite ends of one second guard via GV2 may overlap with ends of two first guard vias GV1. Opposite ends of one third guard via GV3 may overlap with ends of two fourth guard vias GV4. Opposite ends of one fourth guard via GV4 may overlap with ends of two third guard vias GV3. Opposite ends of one fifth guard via GV5 may overlap with ends of two sixth guard vias GV6. Opposite ends of one sixth guard via GV6 may overlap with ends of two fifth guard vias GV5.

As each of the first and second guard structures GS1 and GS2 includes the first to sixth guard vias GV1, GV2, GV3, GV4, GV5 and GV6 disposed to overlap with one another, it may be possible to prevent a magnetic field generated in the first and second active regions AR1 and AR2 from extending outside of the first and second guard structures GS1 and GS2.

The semiconductor device according to example embodiments may include a well region between active regions and, as such, it may be possible to prevent a low-frequency signal generated in one active region from leaking to the other active region.

The semiconductor device according to example embodiments may include a grounded suction region and, as such, it may be possible to prevent a high-frequency signal generated in one active region from leaking to the other active region.

The semiconductor device according to example embodiments may include a guard structure and, as such, it may be possible to prevent a magnetic field generated in an active region from extending to an outside of the guard structure.

Figure 2:
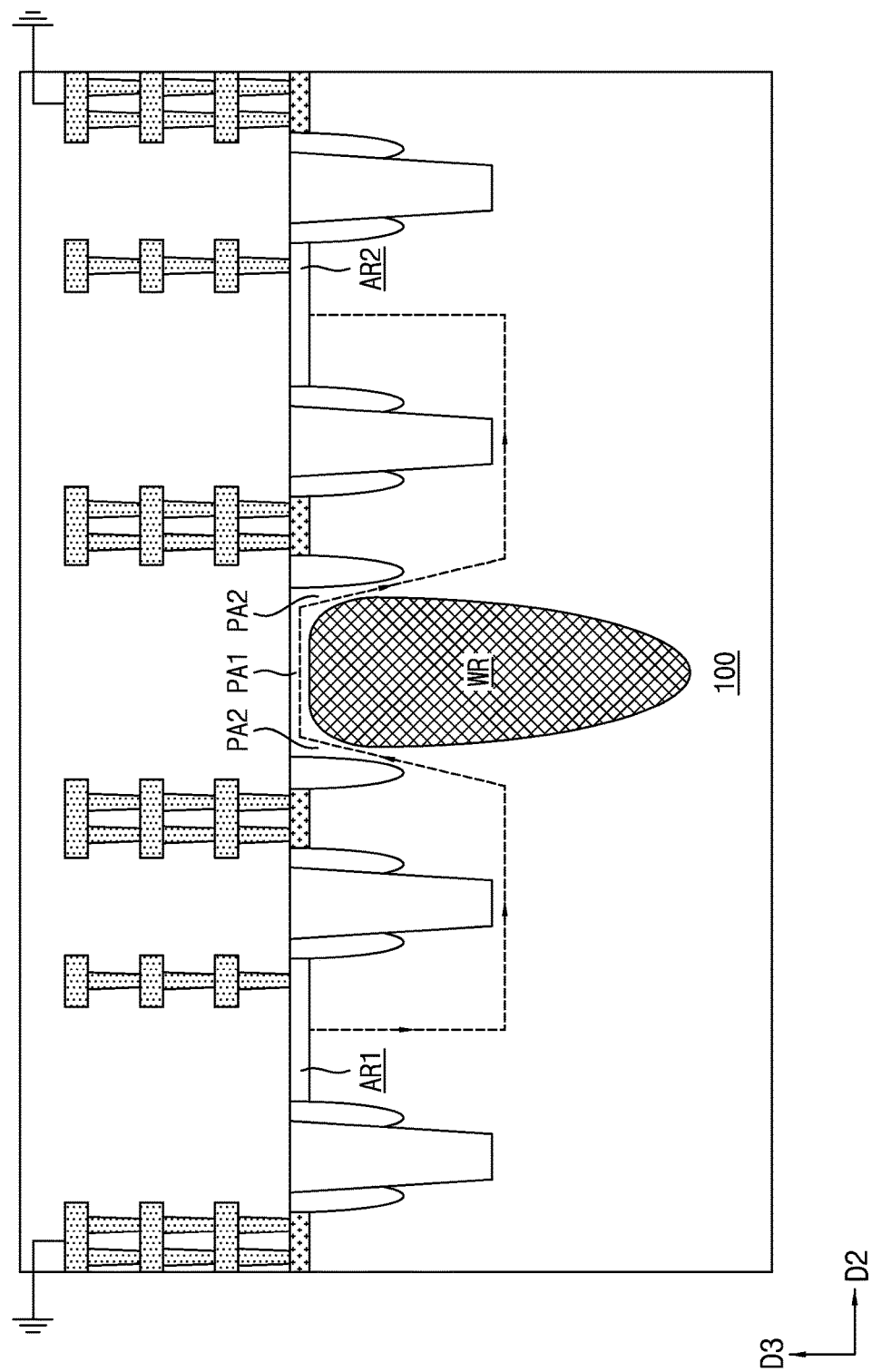
FIG. 2 is a cross-sectional view explaining low-frequency signal blocking effects of the semiconductor device according to example embodiments.

FIG. 2 is a cross-sectional view explaining low-frequency signal blocking effects of the semiconductor device according to example embodiments.

Referring to FIG. 2, a path for transferring, to the second active region AR2, a low-frequency signal (in other words, charges according to a low-frequency signal) generated in the first active region AR1 may include the first path portion PA1 and the second path portion PA2. The well region WR may include impurities of a conductivity type different from that of the substrate 100 and, as such, the low-frequency signal cannot pass through the well region WR, and may move through only the first and second path portions PA1 and PA2 of the substrate 100. Since the low-frequency signal can move through only the first and second path portions PA1 and PA2 of the substrate 100, the movement path of the low-frequency signal may be lengthened and, as such, it may be possible to prevent the low-frequency signal from being transferred from the first active region AR1 to the second active region AR2. The level of a lowermost portion of the well region WR may be sufficiently low and, as such, it may be possible to prevent the low-frequency signal from being transferred from the first active region AR1 to the second active region AR2 after moving beneath the lowermost portion of the well region WR.

Figure 3:
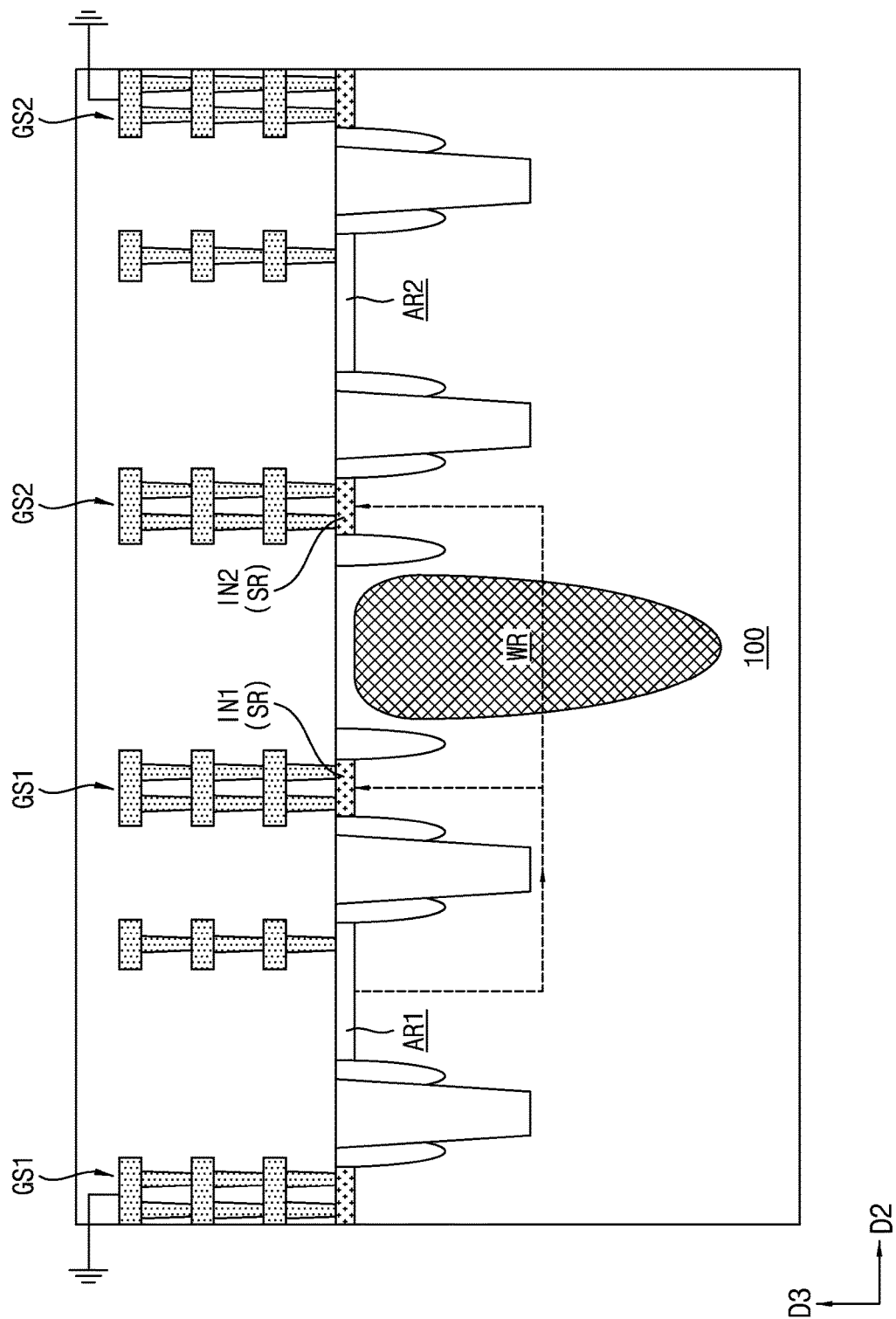
FIG. 3 is a cross-sectional view explaining high-frequency signal blocking effects of the semiconductor device according to example embodiments.

FIG. 3 is a cross-sectional view explaining high-frequency signal blocking effects of the semiconductor device according to example embodiments.

Referring to FIG. 3, a high-frequency signal (in other words, charges according to a high-frequency signal) generated in the first active region AR1 may be suctioned into the first intermediate portion IN1 and the second intermediate portion IN2 of the suction region SR during movement thereof to the second active region AR2. As the suction region SR is grounded via the first guard structure GS1 and the second guard structure GS2, the high-frequency signal may be suctioned into the suction region SR. The high-frequency signal generated in the first active region AR1 may be suctioned into the first intermediate portion IN1, by which the high-frequency signal passes before passing through the well region WR, and the second intermediate portion IN2, by which the high-frequency signal passes after passing through the well region WR. As the high-frequency signal generated in the first active region AR1 is suctioned, it may be possible to prevent the high-frequency signal from being transferred to the second active region AR2.

Figure 4:
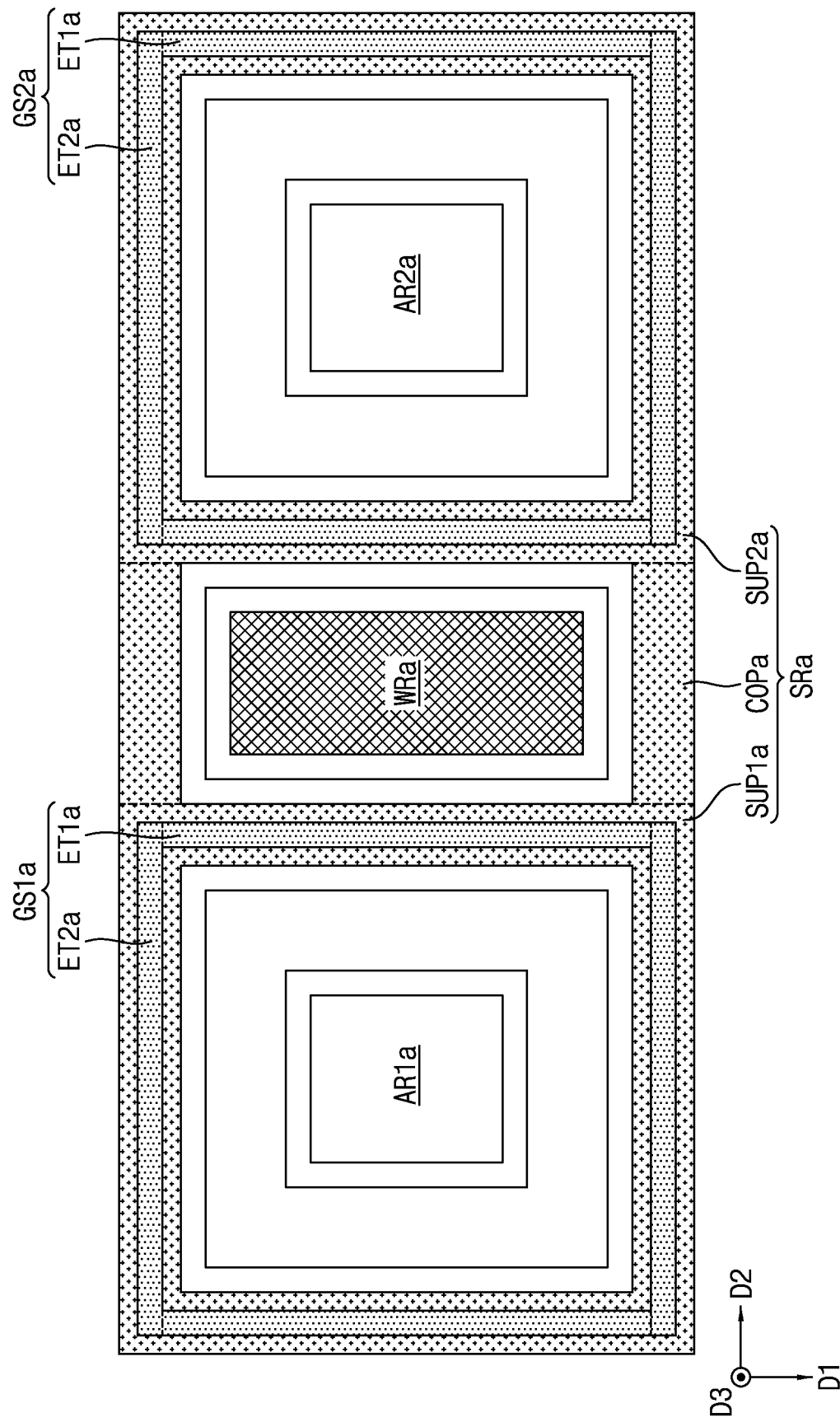
FIG. 4 is a plan view of a semiconductor device according to example embodiments.

FIG. 4 is a plan view of a semiconductor device according to example embodiments.

Referring to FIG. 4, the semiconductor device may include first and second active regions AR1a and AR2a, a well region WRa, a suction region SRa, and first and second guard structures GS1a and GS2a.

The first guard structure GS1a may be disposed on only a first surround section SUP1a of the suction region SRa. The entirety of the first guard structure GS1a may be disposed on the first surround section SUP1a of the suction region SRa. Entireties of first and second extensions ET1a and ET2a of the first guard structure GS1a may overlap with the first surround section SUP1a in a third direction D3. The second guard structure GS2a may be disposed on only a second surround section SUP2a of the suction region SRa. The entirety of the second guard structure GS2a may be disposed on the second surround section SUP2a of the suction region SRa. Entireties of first and second extensions ET1a and ET2a of the second guard structure GS2a may overlap with the second surround section SUP2a in the third direction D3. The first and second guard structures GS1a and GS2a may not be disposed on connecting sections COPa of the suction region SRa.

Figure 5A:
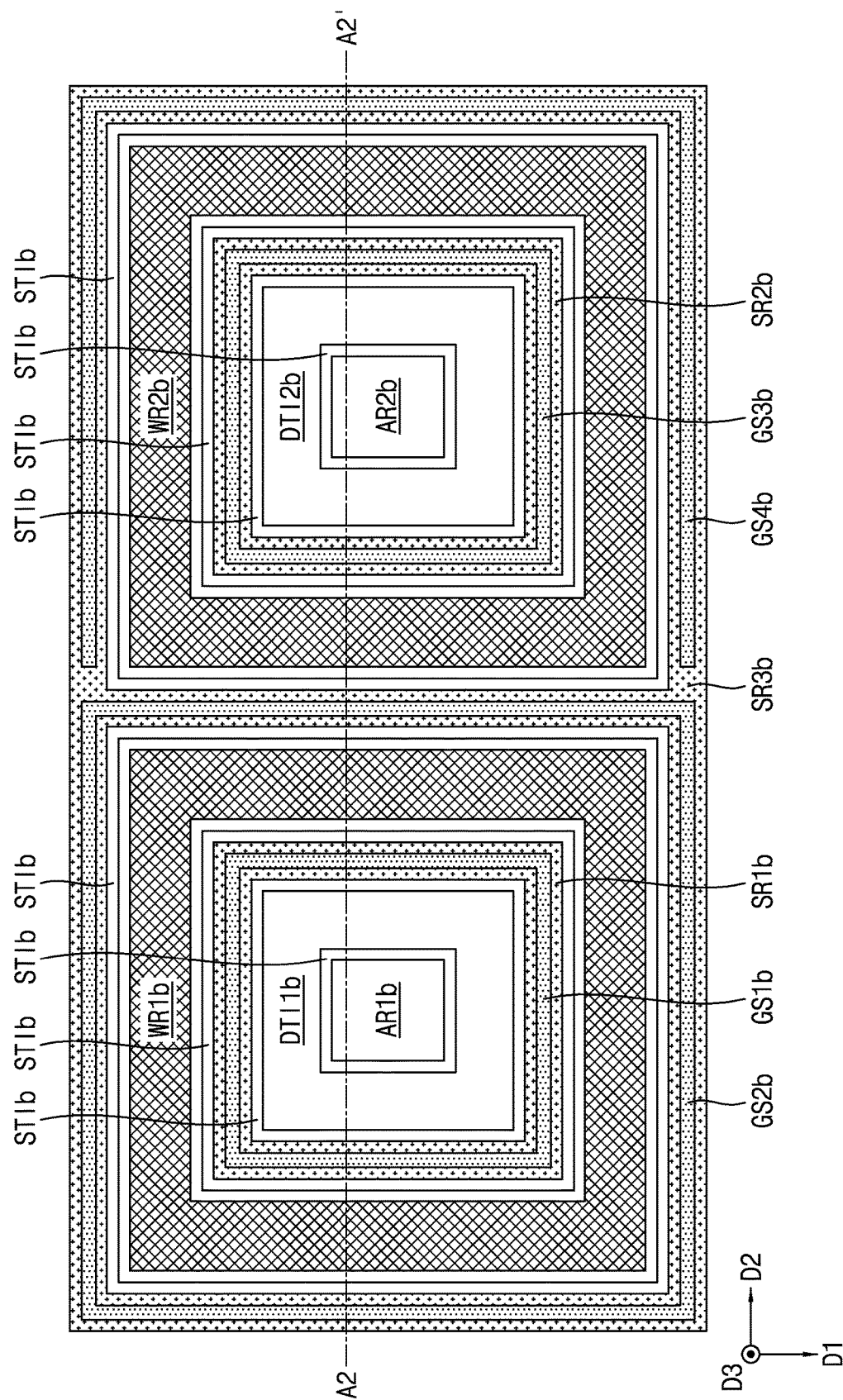
FIG. 5A is a plan view of a semiconductor device according to example embodiments.
Figure 5B:
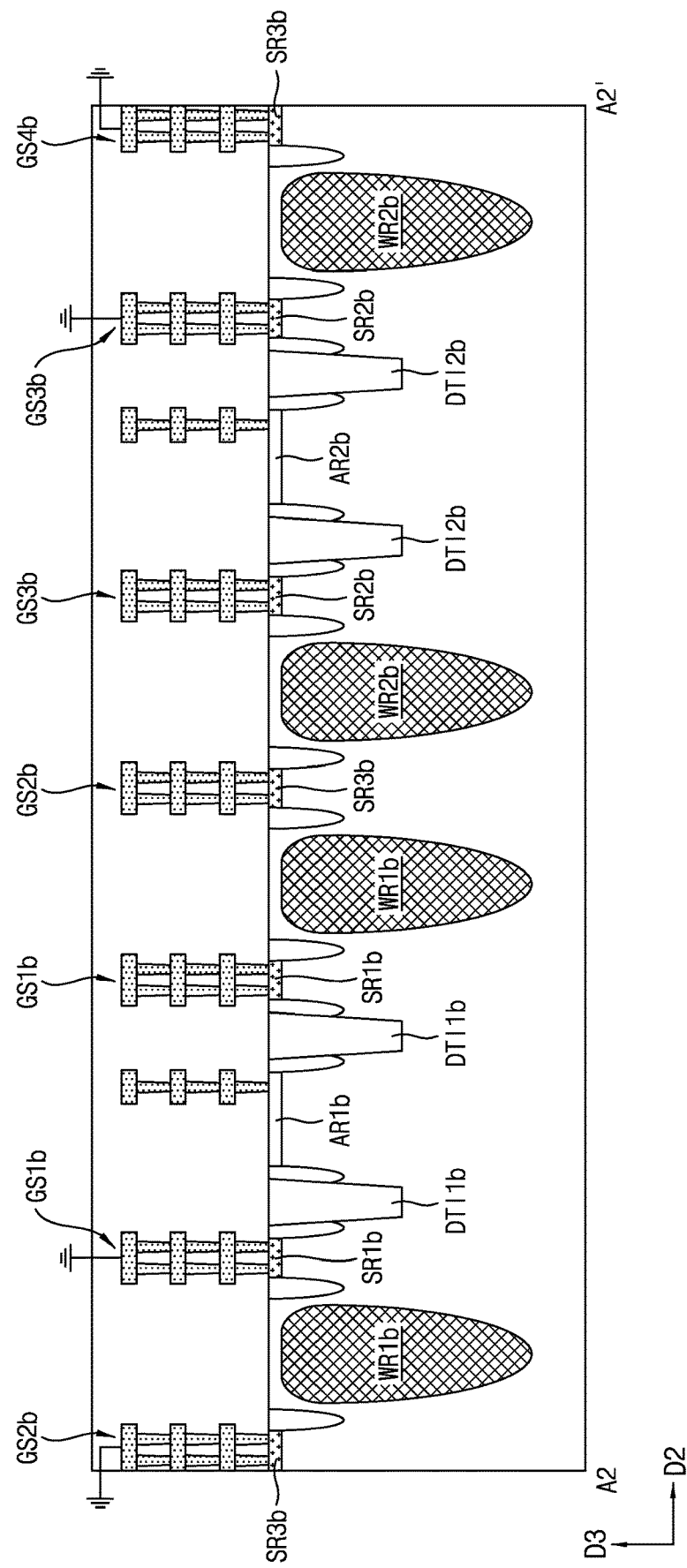
FIG. 5B is a cross-sectional view taken along line A2-A2' in FIG. 5A.

FIG. 5A is a plan view of a semiconductor device according to example embodiments. FIG. 5B is a cross-sectional view taken along line A2-A2' in FIG. 5A.

Referring to FIGS. 5A and 5B, a first active region AR1b, and a first deep element isolation layer DTI1b surrounding at least a portion of the first active region AR1b may be provided, and a second active region AR2b, and a second deep element isolation layer DTI2b surrounding at least a portion of the second active region AR2b may be provided.

A first suction region SR1b and a second suction region SR2b may be provided. The first suction region SR1b may surround at least a portion of each of the first active region AR1b and the first deep element isolation layer DTI1b. The second suction region SR2b may surround at least a portion of each of the second active region AR2b and the second deep element isolation layer DTI2b. The first deep element isolation layer DTI1b may be disposed between the first suction region SR1b and the first active region AR1b. The second deep element isolation layer DTI2b may be disposed between the second suction region SR2b and the second active region AR2b. First and second well regions WR1b and WR2b may be provided. The first well region WR1b may surround the first active region AR1b, the first deep element isolation layer DTI1b and the first suction region SR1b when viewed from a planar viewpoint according to FIG. 5A. The second well region WR2b may surround the second active region AR2b, the second deep element isolation layer DTI2b and the second suction region SR2b when viewed from a planar viewpoint according to FIG. 5A. A portion of the first well region WR1b and a portion of the second well region WR2b may be disposed between the first active region AR1b and the second active region AR2b.

A third suction region SR3b may be provided. The third suction region SR3b may surround the first and second active regions AR1b and AR2b, the first and second suction regions SR1b and SR2b, and the first and second well regions WR1b and WR2b when viewed from a planar viewpoint according to FIG. 5A. The first well region WR1b may be disposed between the third suction region SR3b and the first suction region SR1b. The second well region WR2b may be disposed between the third suction region SR3b and the second suction region SR2b.

Shallow element isolation layers STIb may be provided. The shallow element isolation layer STIb may be provided between the first active region AR1b and the first deep element isolation layer DTI1b, between the first suction region SR1b and the first deep element isolation layer DTI1b, between the first well region WR1b and the first suction region SR1b, between the third suction region SR3b and the first well region WR1b, between the second active region AR2b and the second deep element isolation layer DTI2b, between the second suction region SR2b and the second deep element isolation layer DTI2b, between the second well region WR2b and the second suction region SR2b, or between the third suction region SR3b and the second well region WR2b.

First to fourth guard structures GS1b, GS2b, GS3b and GS4b may be provided. The first guard structure GS1b may be provided on the first suction region SR1b. The third guard structure GS3b may be provided on the second suction region SR2b. The second and fourth guard structures GS2b and GS4b may be provided on the third suction region SR3b.

The first guard structure GS1b may surround the first active region AR1b and the first deep element isolation layer DTI1b when viewed from a planar viewpoint according to FIG. 5A. The third guard structure GS3b may surround the second active region AR2b and the second deep element isolation layer DTI2b when viewed from a planar viewpoint according to FIG. 5A. The second guard structure GS2b may surround the first active region AR1b, the first deep element isolation layer DTI1b, the first suction region SR1b and the first well region WR1b when viewed from a planar viewpoint according to FIG. 5A. The fourth guard structure GS4b may be provided on a portion of the third suction region SR3b surrounding the second active region AR2b, the second deep element isolation layer DTI2b, the second suction region SR2b and the second well region WR2b. The fourth guard structure GS4b may be spaced apart from the second guard structure GS2b.

Figure 6:
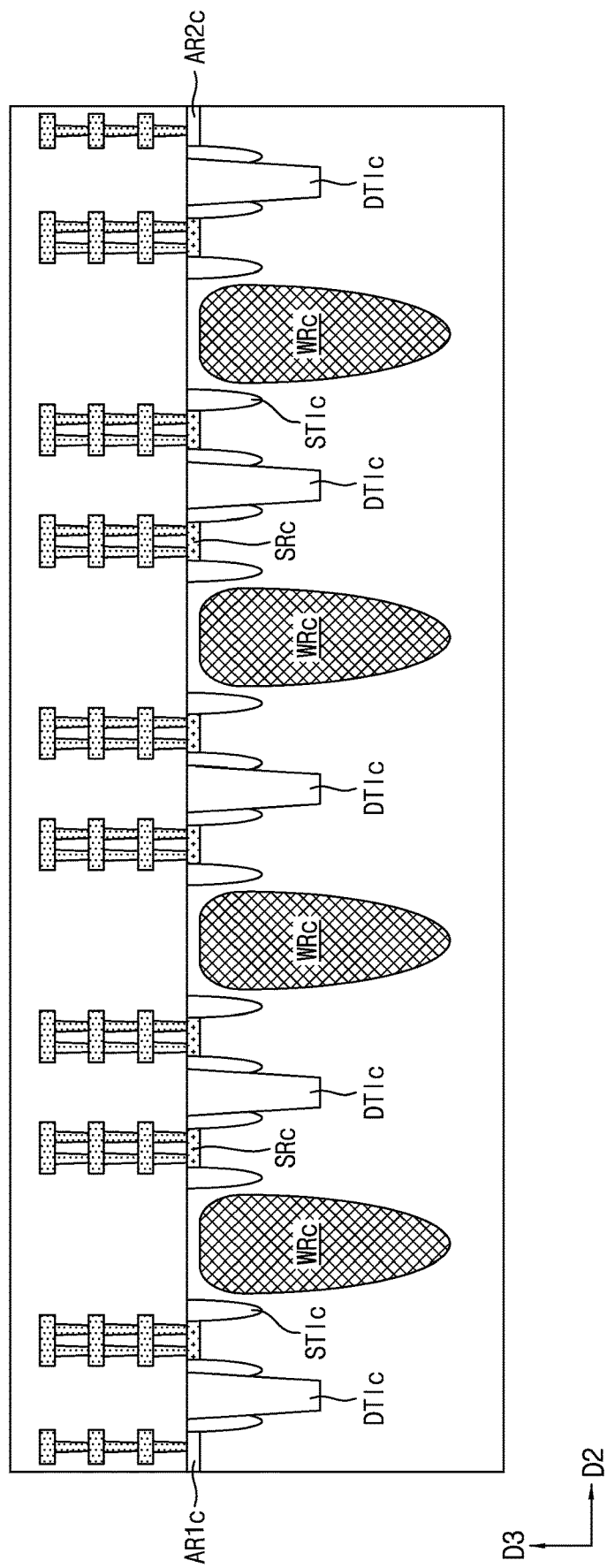
FIG. 6 is a cross-sectional view of a semiconductor device according to example embodiments.

FIG. 6 is a cross-sectional view of a semiconductor device according to example embodiments.

Referring to FIG. 6, a plurality of well regions WRc may be provided between a first active region AR1c and a second active region AR2c. For example, four well regions WRc may be provided between the first active region AR1c and the second active region AR2c.

A deep element isolation layer DTIc may be provided between adjacent ones of the well regions WRc. In example embodiments, only shallow element isolation layers STIc may be provided between the adjacent well regions WRc, differently from the shown case.

A plurality of suction regions SRc may be provided between the adjacent well regions WRc. For example, two suction regions SRc may be provided between the adjacent well regions WRc.

The semiconductor device according to example embodiments may have relatively high signal blocking performance as a plurality of well regions WRc is disposed between the first and second active regions AR1c and AR2c, and a plurality of suction regions WRc is disposed between adjacent ones of the well regions WRc.

The semiconductor device according to example embodiments may include a well region, a suction region and a guard structure and, as such, a low-frequency signal, a high-frequency signal and a magnetic field, which are generated in the active region, may be effectively blocked.

While example embodiments have been shown described, it should be understood by those skilled in the art that various modifications may be made without departing from the scope of the appended claims.

What is claimed is:

1. A semiconductor device comprising:
a substrate comprising first-conductivity-type impurities;
a first active region and a second active region provided on the substrate;
a first deep element isolation layer surrounding the first active region;
a second deep element isolation layer surrounding the second active region;
a suction region surrounding the first deep element isolation layer and the second deep element isolation layer, the suction region comprising the first-conductivity-type impurities;
a well region provided in the substrate between the first active region and the second active region, the well region comprising second-conductivity-type impurities different from the first-conductivity-type impurities;
a shallow element isolation layer provided between the suction region and the well region; and
a guard structure connected to the suction region,
wherein the substrate comprises a signal path portion that is provided between a top surface of the substrate and the well region, and surrounds an upper portion of the well region.

2. The semiconductor device according to claim 1, wherein the signal path portion comprises a first path portion and a second path portion, wherein the first path portion is provided above an upper surface of the well region, and the second path portion provided below the upper surface of the well region.

3. The semiconductor device according to claim 2, wherein:
the well region is spaced apart from the shallow element isolation layer; and
the second path portion is provided between the well region and the shallow element isolation layer.

4. The semiconductor device according to claim 1, wherein:
the well region is spaced apart from the shallow element isolation layer; and
a minimum distance between the shallow element isolation layer and the well region is smaller than a maximum width of the shallow element isolation layer along a first direction parallel to the top surface of the substrate.

5. The semiconductor device according to claim 1, wherein a minimum distance between the top surface of the substrate corresponding to the signal path portion and an upper surface of the well region is smaller than a maximum width of the shallow element isolation layer along a first direction parallel to the top surface of the substrate.

6. The semiconductor device according to claim 1, wherein a concentration of the first-conductivity-type impurities in the suction region is higher than a concentration of the first-conductivity-type impurities in the substrate.

7. The semiconductor device according to claim 1, wherein:
the guard structure comprises first guard vias and second guard vias provided on the suction region, and a first guard line provided on both the first guard vias and the second guard vias; and
an outer longer side wall of one of the first guard vias faces inner longer side walls of two of the second guard vias.

8. The semiconductor device according to claim 1, wherein:
the well region comprises a plurality of well regions; and
the suction region comprises a plurality of suction regions provided between two of the plurality of well regions that are adjacent to each other.

9. A semiconductor device comprising:
a substrate comprising first-conductivity-type impurities;
a first active region and a second active region provided on the substrate;
a suction region surrounding the first active region and the second active region, the suction region comprising the first-conductivity-type impurities; and
a well region provided in the substrate between the first active region and the second active region, the well region comprising second-conductivity-type impurities different from the first-conductivity-type impurities,
wherein the well region is spaced apart from a top surface of the substrate and the suction region, and
wherein a minimum distance between the well region and the top surface of the substrate is smaller than a width of the suction region along a first direction parallel to the top surface of the substrate.

10. The semiconductor device according to claim 9, wherein:
the substrate comprises a first path portion provided between the top surface of the substrate and the well region; and
the first path portion comprises the first-conductivity-type impurities.

11. The semiconductor device according to claim 10, wherein the first path portion covers an uppermost portion of the well region that faces the top surface of the substrate.

12. The semiconductor device according to claim 9, further comprising:
a guard structure connected to the suction region.

13. The semiconductor device according to claim 12, wherein the guard structure is connected to a ground node.

14. The semiconductor device according to claim 9, further comprising:
a shallow element isolation layer provided between the suction region and the well region.

15. The semiconductor device according to claim 14, wherein the substrate comprises a first path portion and a second path portion, wherein the first path portion is provided between the top surface of the substrate and the well region, and the second path portion is provided between the shallow element isolation layer and the well region.

16. The semiconductor device according to claim 14, wherein a minimum distance between the well region and the shallow element isolation layer is smaller than the width of the suction region.

17. A semiconductor device comprising:
a substrate comprising first-conductivity-type impurities;
an active region provided on the substrate;
a suction region surrounding the active region and comprising the first-conductivity-type impurities; and
a guard structure connected to the suction region,
wherein the guard structure comprises first guard vias and second guard vias provided on the suction region, and a first guard line provided on the first guard vias and the second guard vias, and wherein an outer longer side wall of one of the first guard vias faces inner longer side walls of two of the second guard vias.

18. The semiconductor device according to claim 17, wherein the guard structure is connected to a ground node.

19. The semiconductor device according to claim 17, wherein shorter side walls of two of the first guard vias face each other.

20. The semiconductor device according to claim 17, further comprising:
   a well region provided in the substrate,
   wherein the well region comprises second-conductivity-type impurities different from the first-conductivity-type impurities.

\* \* \* \* \*